(12) United States Patent
Lundmark

(10) Patent No.: US 12,035,496 B2
(45) Date of Patent: *Jul. 9, 2024

(54) CABLE SEALING ASSEMBLY

(71) Applicant: TELEFONAKTIEBOLAGET LM ERICSSON (PUBL), Stockholm (SE)

(72) Inventor: Gustav Lundmark, Sigtuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,548

(22) Filed: Apr. 24, 2023

(65) Prior Publication Data

US 2023/0269894 A1    Aug. 24, 2023

Related U.S. Application Data

(63) Continuation of application No. 17/848,512, filed on Jun. 24, 2022, now Pat. No. 11,665,842, which is a
(Continued)

(51) Int. Cl.
*H05K 5/02* (2006.01)
*H02B 1/28* (2006.01)
(Continued)

(52) U.S. Cl.
CPC ............. *H05K 5/0247* (2013.01); *H02B 1/28* (2013.01); *H02B 1/305* (2013.01); *H02G 3/22* (2013.01)

(58) Field of Classification Search
None
See application file for complete search history.

(56) References Cited

U.S. PATENT DOCUMENTS

| 5,422,436 A | 6/1995 | Zachrai |
| 5,529,508 A * | 6/1996 | Chiotis .............. H01R 13/5216 439/204 |

(Continued)

FOREIGN PATENT DOCUMENTS

| CN | 203057757 U | 7/2013 |
| CN | 104272495 A | 1/2015 |

(Continued)

OTHER PUBLICATIONS

Decision To Grant in corresponding/related Russian Application No. 2020120259 dated Dec. 29, 2020.
(Continued)

*Primary Examiner* — Xanthia C Relford
(74) *Attorney, Agent, or Firm* — PATENT PORTFOLIO BUILDERS PLLC

(57) ABSTRACT

A cable sealing assembly for a cable entry in a cabinet housing electronic equipment. The cable sealing assembly comprises a tongue-shaped protruding member, an elastic cable sealing member configured to be shaped around the edge of the tongue-shaped protruding member and a corresponding recessed member configured to receive the protruding member and the cable sealing member in between. The elastic cable sealing member has a plurality of through holes forming a single row, each hole configured to have a cable extending there through. The cable sealing assembly is configured to seal the cable entry when the protruding member and the recessed member together apply an even pressure on the cable sealing member.

17 Claims, 5 Drawing Sheets

Related U.S. Application Data continuation of application No. 16/759,833, filed as application No. PCT/SE2017/051154 on Nov. 22, 2017, now Pat. No. 11,452,223.

(51) Int. Cl.
*H02B 1/30* (2006.01)
*H02G 3/22* (2006.01)

(56) References Cited

U.S. PATENT DOCUMENTS

| | | | | |
|---|---|---|---|---|
| 5,655,738 | A * | 8/1997 | Ragsdale | H02G 3/26 248/74.1 |
| 5,834,693 | A * | 11/1998 | Waddell | H02G 3/22 439/94 |
| 6,190,185 | B1 * | 2/2001 | Daoud | H01R 13/447 439/142 |
| 6,469,244 | B1 | 10/2002 | Harrison et al. | |
| 6,561,466 | B1 * | 5/2003 | Myers | F16L 3/221 248/68.1 |
| 6,717,055 | B2 * | 4/2004 | Kato | H02G 3/32 173/136 |
| 6,787,701 | B2 * | 9/2004 | Yasuda | H01R 13/5208 174/152 G |
| 6,927,336 | B2 * | 8/2005 | Huang | H04M 19/00 174/541 |
| 7,087,838 | B2 * | 8/2006 | Ferderer | H01R 13/5205 439/271 |
| 7,201,352 | B2 * | 4/2007 | Kawai | F16L 3/1075 248/68.1 |
| 7,273,984 | B2 * | 9/2007 | Murphy | H02G 15/18 174/92 |
| 7,345,241 | B2 * | 3/2008 | Caveney | H04Q 1/06 174/99 R |
| 8,074,945 | B2 * | 12/2011 | Schoenau | F16L 5/14 248/65 |
| 8,541,698 | B2 | 9/2013 | Perschon et al. | |
| 8,620,128 | B2 * | 12/2013 | Holmberg | G02B 6/4471 385/135 |
| 8,783,629 | B2 * | 7/2014 | Even | F03D 80/85 248/68.1 |
| 8,985,533 | B2 * | 3/2015 | Edmond | F16L 3/1222 248/74.1 |
| 9,038,967 | B2 * | 5/2015 | Struck | F16L 57/04 248/74.1 |
| 9,106,068 | B2 * | 8/2015 | Barna | H02G 3/32 |
| 9,190,820 | B2 | 11/2015 | Nurmi et al. | |
| 9,350,152 | B2 * | 5/2016 | Andresen | H01R 43/20 |
| 9,425,604 | B1 * | 8/2016 | Lawrence | H02G 15/007 |
| 9,685,770 | B2 * | 6/2017 | Park | H02G 3/22 |
| 9,706,671 | B2 | 7/2017 | Juventin et al. | |
| 9,971,120 | B2 * | 5/2018 | Rudenick | G02B 6/4479 |
| 10,122,157 | B1 * | 11/2018 | Gintz | H02G 3/0437 |
| 10,372,174 | B2 * | 8/2019 | Baum | H05K 7/16 |
| 2007/0110373 | A1 * | 5/2007 | Dudek | G02B 6/4292 385/91 |
| 2009/0218451 | A1 * | 9/2009 | Lundborg | H02G 11/00 248/65 |
| 2009/0302034 | A1 * | 12/2009 | Makela | H02G 3/088 174/152 G |
| 2010/0243855 | A1 * | 9/2010 | Sampson | F16L 3/127 248/534 |
| 2011/0080078 | A1 * | 4/2011 | Perschon | H02B 1/50 248/68.1 |
| 2011/0090297 | A1 | 4/2011 | Arai et al. | |
| 2012/0205500 | A1 * | 8/2012 | Cox | H02G 3/0493 248/65 |
| 2013/0140410 | A1 * | 6/2013 | Lee | F16C 1/105 248/74.2 |
| 2013/0161090 | A1 | 6/2013 | Nurmi et al. | |
| 2016/0266344 | A1 * | 9/2016 | Sievers | G02B 6/46 |
| 2017/0010423 | A1 | 1/2017 | Lu | |

FOREIGN PATENT DOCUMENTS

| | | |
|---|---|---|
| FR | 2537794 A1 | 6/1984 |
| JP | 2009502077 A | 1/2009 |
| JP | 6014420 B2 | 10/2016 |
| KR | 100285532 B1 | 4/2001 |
| KR | 100835679 B1 | 6/2008 |
| RU | 86055 U1 | 8/2009 |
| RU | 2611687 C2 | 2/2017 |

OTHER PUBLICATIONS

Examination Report in corresponding/related Indian Patent Application No. 202047025470 dated May 20, 2021.
Fujitsu, 3GPP TSG RAN WG1, "On remaining details of synchronization signal," R1-1717713, Meeting 90bis Prague, Czech Republic, Oct. 9-13, 2017, pp. 1-7.
International Search Report / Written Opinion in related/corresponding PCT Application No. PCT/SE2017/051154 dated Aug. 13, 2018.
Notice of Allowance in related/corresponding Korean Application No. 2022-7009270 dated Mar. 28, 2022.
Notice of Final Rejection in corresponding/related Korean Application No. 2020-7016848 dated Feb. 24, 2022, including partial English translation.
Office Action in related/corresponding Colombian Application No. NC2020/0007052 dated Jul. 8, 2022.
Official Communication in corresponding/related Chinese Application No. 201780098093.8 dated Dec. 28, 2020.
Search Report in corresponding/related Russian Application No. 2020120259 dated Dec. 29, 2020.

\* cited by examiner

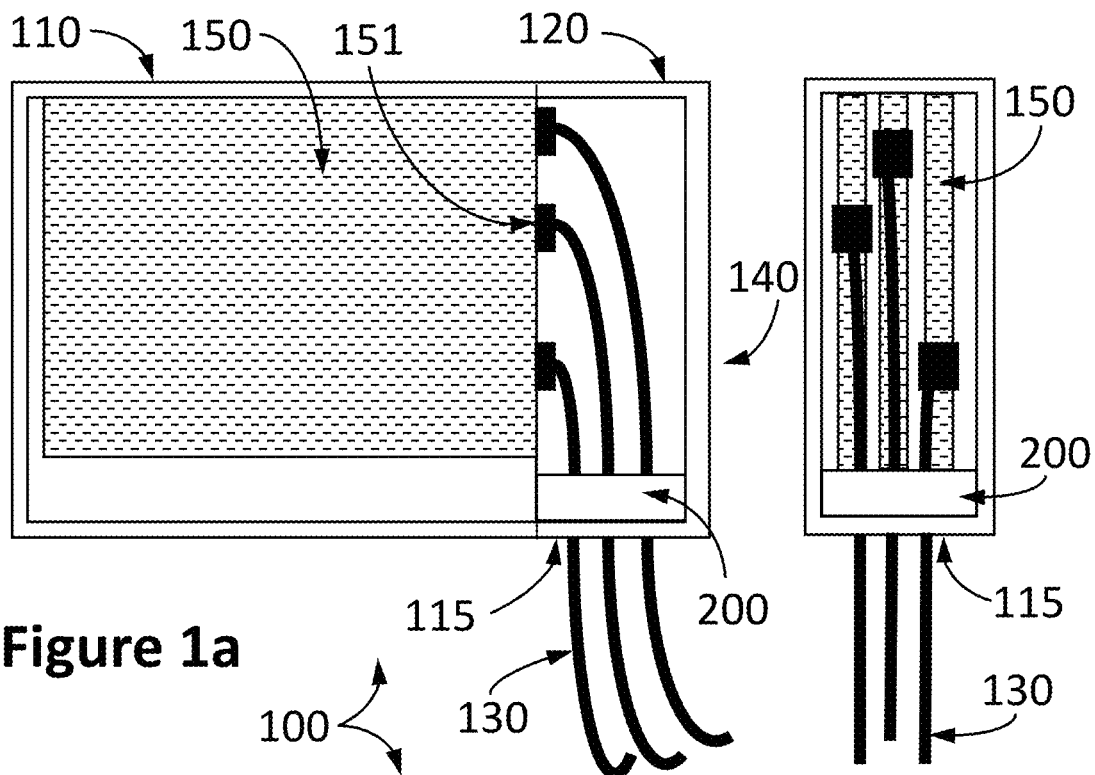
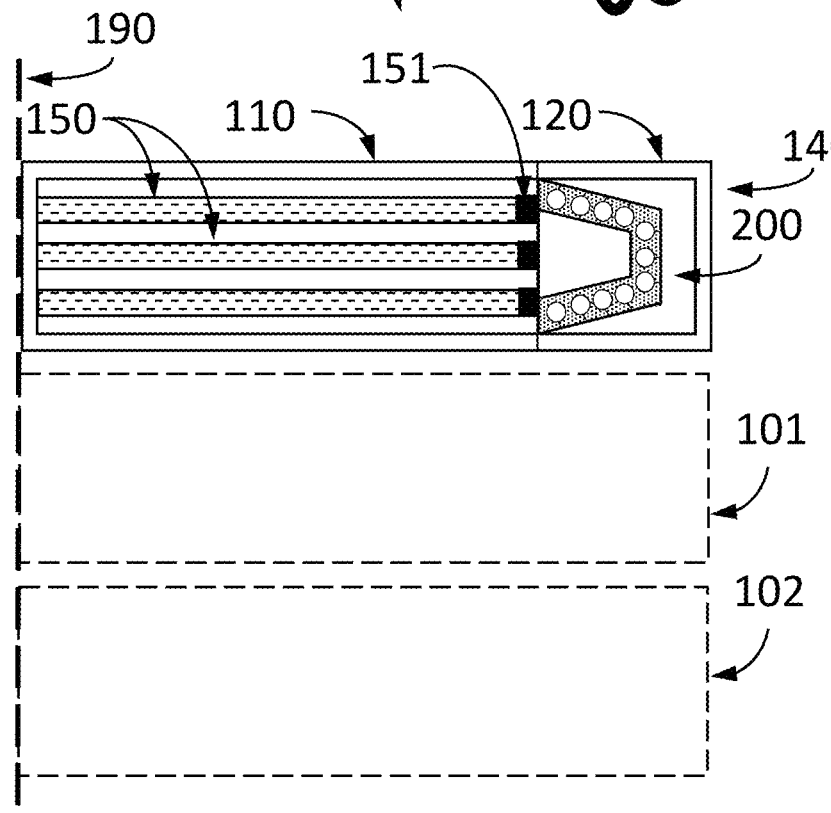

CABLE SEALING ASSEMBLY

TECHNICAL FIELD

The disclosure relates to a cable sealing assembly for a cabinet housing electronic equipment.

BACKGROUND

Electronic equipment like base station transceivers, servers and routers are normally mounted in cabinets. In outdoor installations it is important that the cable entry to the cabinet is securely sealed to prevent dust and humidity to enter the cabinet and damage the electronics. A cable entry for outdoor equipment is often designed to receive a plurality of cables. These can be of different sorts and sizes (copper, fibre), or having different purposes (power, transmission, signalling etc).

U.S. Pat. No. 8,541,698 discloses an example of a cable distribution cabinet having a cable entry underneath the cabinet comprising a base plate for receiving and sealing a plurality of cables entering the cabinet. Within the base plate a plurality of elastic sealing blocks is threaded on guide rods resulting in two straight lines of holes for receiving cables. The cabinet in U.S. Pat. No. 8,541,698 is further configured with front doors allowing access to the cables and the electronics.

In compact installations where the cable entry is concentrated to a relatively small area underneath the cabinet, the cables need to be stacked in multiple rows or in bundles. This makes it difficult to access all cables during maintenance or upgrades of the cable configuration. Connecting or disconnecting the innermost cables in the stack for example, will be very difficult without interfering with or disconnecting other cables in front of the innermost cables.

Another problem is that with cable sealings having a plurality of through holes configured to receive a bundle of cables, it is difficult to apply an even pressure on the sealing for each individual cable.

SUMMARY

With this background it is the object of the embodiments described below to obviate at least one of these disadvantages.

The object is achieved by a cable sealing assembly having a tongue-shaped protruding member, an elastic cable sealing member and a corresponding recessed member configured to receive the protruding member and the cable sealing member in between. The elastic cable sealing member has a plurality of through holes forming a single row, each hole configured to have a cable extending there through and wherein the cable sealing member is configured to be shaped around the edge of the tongue-shaped protruding member. The cable sealing assembly is further configured to seal the cable entry when the protruding member and the recessed member together apply an even pressure on the cable sealing member. In one embodiment, the even pressure is achieved when the cabinet's detachable cover engages with the cable sealing assembly so that the protruding member and the recessed member applies the even pressure on the cable sealing member when the cover is mounted to the cabinet.

An advantage with the tongue-shaped assembly is that as the cables are mounted in a single row around the protruding member each individual cable can easily be accessed, inserted in or removed from the seal and plugged into or removed from the socket of the electronics without interfering with other cables. Another advantage is that when an even pressure is applied on the elastic cable sealing member it ensures that an even pressure is applied on each cable so that the cable entry becomes water and dust proof.

BRIEF DESCRIPTION OF THE DRAWINGS

FIGS. 1a-1c are block diagrams illustrating a cabinet having a cable entry and a cable sealing assembly according to any of the described embodiments.

DETAILED DESCRIPTION

Figure 2:
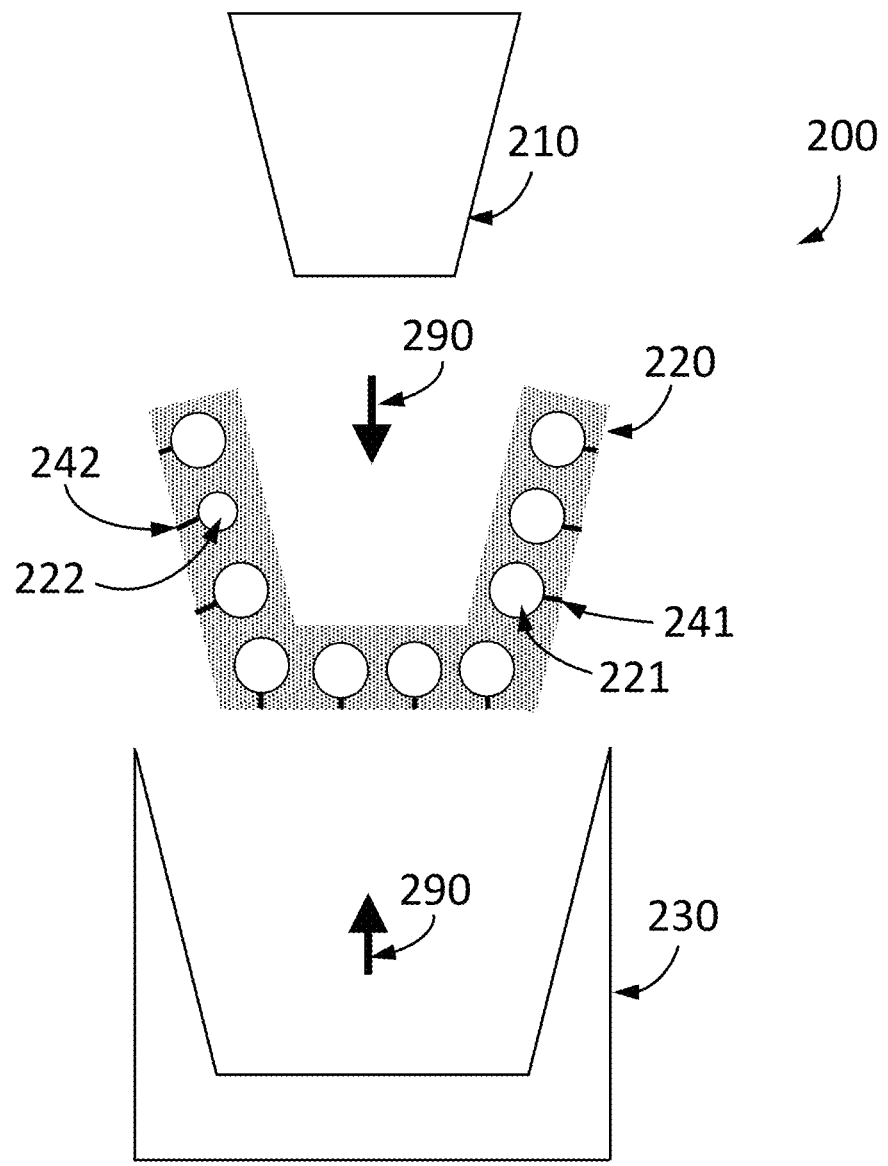
FIG. 2 is a block diagram illustrating a first embodiment of a cable sealing assembly and its members.

FIGS. 1a-1c illustrate an outdoor installation of a cabinet 100 having a cable sealing assembly 200 as in any of the described embodiments. FIG. 1a is a cross-section of a side view, FIG. 1b is a cross-section of a front view and FIG. 1c is a cross-section of a top and/or bottom view of said cabinet 100.

FIG. 1c also illustrates a compact installation comprising a plurality 100,101,102 of such cabinets 100. The cabinets 100,101,102 are all mounted side by side on a rail 190 which for example can be located on a wall. One short side of the cabinet 100 faces the rail 190, the other short side is the front 140.

The cabinet 100 comprises a metal enclosure 110 configured to house electronic and/or photonic equipment (such as digital baseband units, radio transceivers etc) comprising one or several printed circuit boards (PCBs) 150. The PCB(s) 150 comprise sockets 151 for plugging the cables 130 entering the cabinet 100 to the electronics. Each socket 151 faces the front 140 of the cabinet 100 and the cables 130 enter the cabinet 100 through a cable entry 115 underneath and at the front 140. The cables 130 can be of different sorts (copper and/or fibre) and diameters. For maintenance or upgrades of the cable configuration, the front 140 is provided with a metal detachable cover 120. To meet outdoor installation requirements, the cable entry 115 is further provided with a cable sealing assembly 200.

FIG. 2 illustrates a first embodiment of a cable sealing assembly 200 comprising a tongue-shaped protruding member 210, an elastic cable sealing member 220 and a corresponding recessed member 230 configured to receive the protruding member 210 and the cable sealing member 220 in between. The cable sealing member 220 is made of a silicon based material or a thermo plastic material preferably within the flexibility range of A30-A50 on the Shore hardness scale. The sealing member 220 has further a plurality of through holes 221,222 (that could have different diameters) that forms a single row, each hole configured to have a cable 130 extending there through. Each hole 221,222 is further configured with a slit 241,242 extending from the hole 221,222 to the exterior of the sealing member 220 and facing the recessed member 230 as to permit the insertion of a cable 130 when pulled apart. In this embodiment, the cable sealing member 220 is moulded in one piece having a V- or U-shape and configured to be shaped around the edge of the tongue-shaped protruding member 210. To seal the cable entry 115 when the cables 130 are mounted, the protruding member 210 and the recessed member 230 are configured to together apply an even pressure 290 on the cable sealing member 220.

Figure 3:
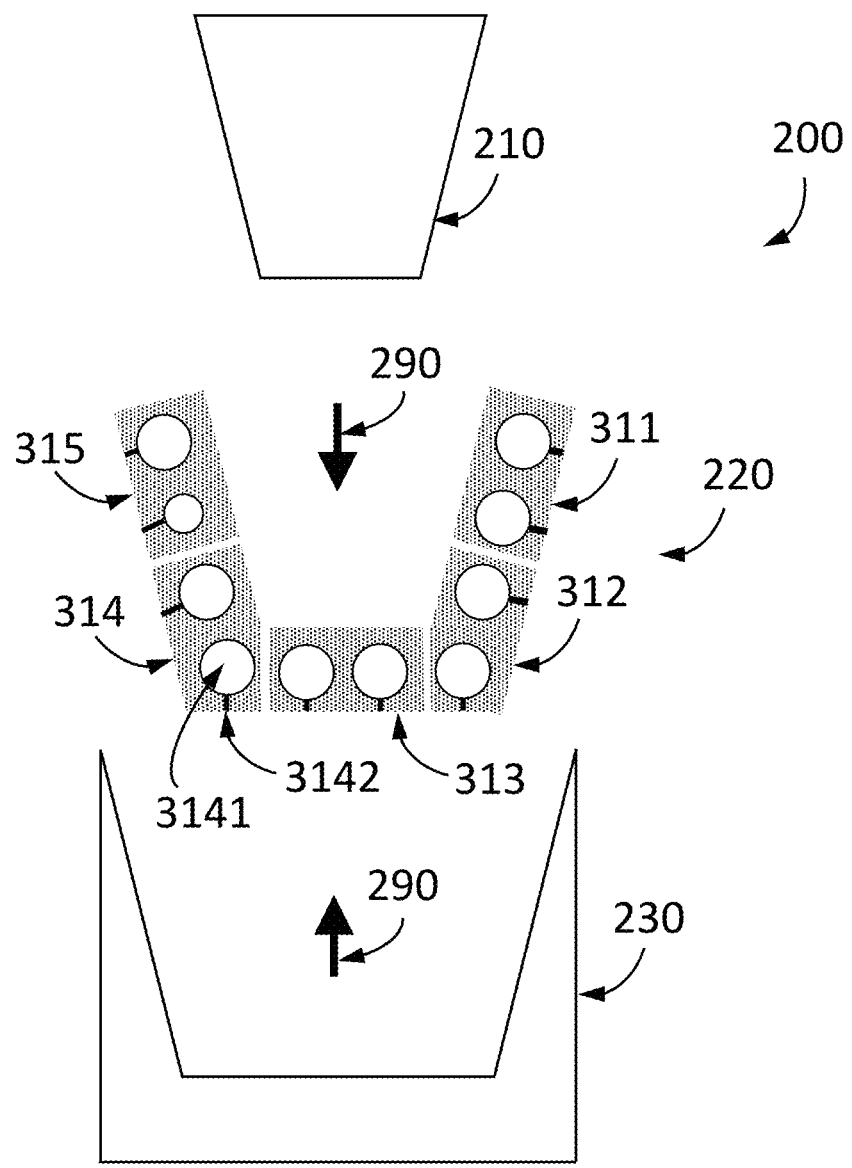
FIG. 3 is a block diagram illustrating a second embodiment of a cable sealing assembly and its members.

In a second embodiment as illustrated by FIG. 3, the cable sealing member 220 comprises a plurality of sealing elements 311-315 which put together forms the sealing member 220. Each element 311-315 is configured with at least one hole 3141 with a slit 3142 facing the recessed member 230. Again, to seal the cable entry 115, the protruding member 210 and the recessed member 230 are configured to together apply an even pressure 290 on the sealing elements 311-315.

Figure 4:
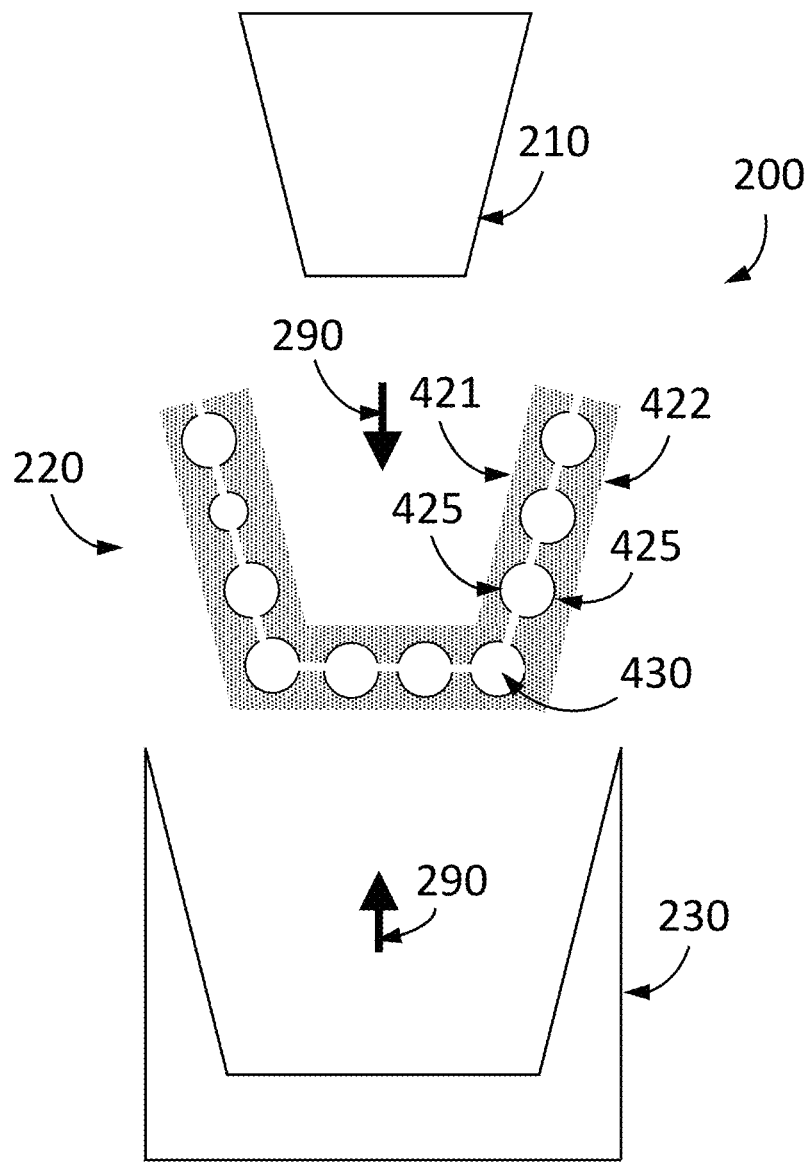
FIG. 4 is a block diagram illustrating a third embodiment of a cable sealing assembly and its members.

In a third embodiment illustrated by FIG. 4, the cable sealing member 220 comprises a first 421 and a second 422 v- or u-shaped sealing element each sealing element 421,422 moulded in one piece and having a plurality of semi-circular cavities 425 in a row. When the two sealing elements 421,422 are put together with the cavities 425 face to face, they form the sealing member 220 with through holes 430, each hole 430 configured to have a cable 130 extending there through.

In the third embodiment both sealing elements 421,422 can be loose elements but preferably the first sealing element 421 is attached to the protruding member 210 and the second sealing element 422 is attached to the recessed member 230.

Figure 5:
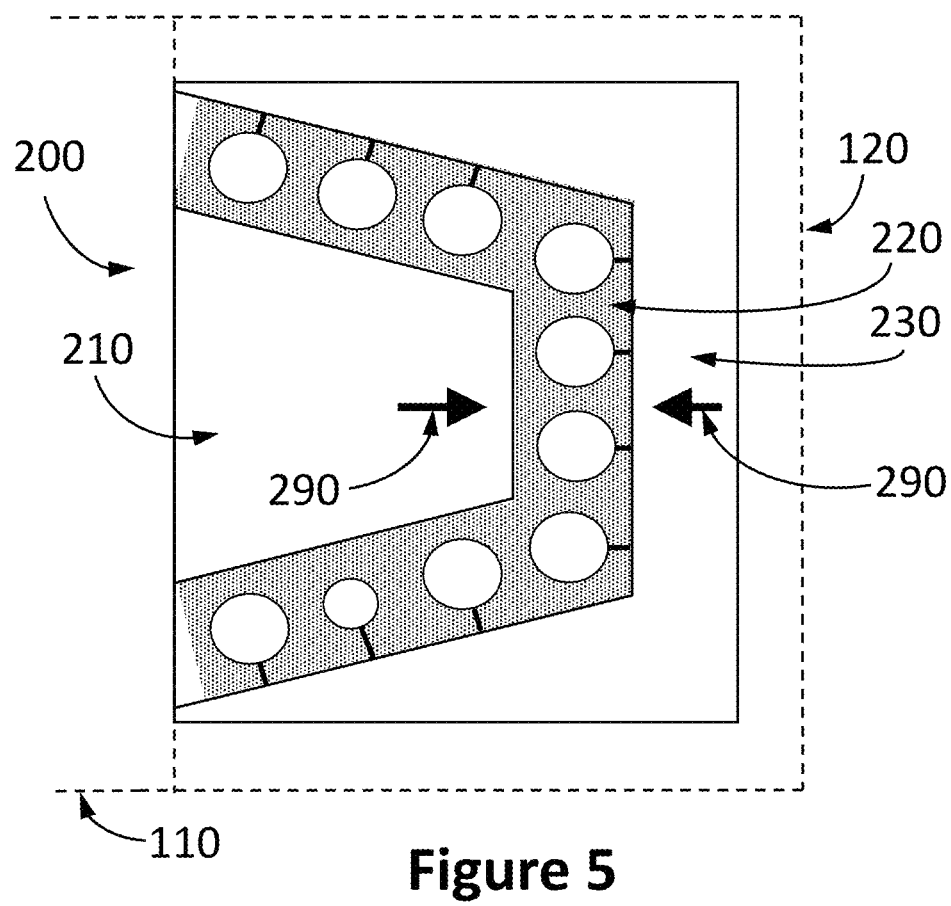
FIG. 5 is a more detailed block diagram illustrating an embodiment of a cable sealing assembly when mounted in a cabinet.

FIGS. 1a-1c and FIG. 5 illustrate the cable sealing assembly 200 when mounted in the cable entry 115 of the cabinet 100. FIG. 5 shows a closer view illustrating that when the detachable cover 120 is mounted to the enclosure 110, it engages with the cable sealing assembly 200 so that an even pressure 290 is applied on the sealing member 220.

For the different embodiments of the cable sealing assembly 200 it is preferred that the protruding member 210 and the recessed member 230 are of metal and fixed to or being an integral part of the enclosure 110 and the detachable cover 120 respectively.

The cable sealing member 220 on the other hand is preferred to be easily replaceable. The sealing member 220 could optionally be kept in place on the protruding member 210 or the recessed member 230 by gluing or some other fastening means as long as it is easy to remove and attach.

Optionally, the cable sealing member 220 is at least partly covered with a conductive layer configured to provide a low impedance path between the protruding member 210 and the recessed member 230 when the cable entry 115 is sealed. The purpose of the conductive layer is to improve the electrical shielding performance, to be able to comply to relevant Electromagnetic Compatibility (EMC) requirements. When the cabinet 100 is mounted in close vicinity of radio frequency (RF) equipment, the conductive layer is also used to improve the PIM (Passive Intermodulation) performance.

As the cables 130 are mounted in a single row in the tongue-shaped cable sealing assembly 200, each individual cable 130 can easily be accessed and each cable can be inserted in or removed from the seal and plugged into or removed from the socket 151 on the PCB 150 without interfering with other cables.

The installation procedure when using the first or the second embodiment of the cable sealing assembly 200, is to remove the detachable cover 120 exposing the cable sealing assembly 200. The cables 130 are inserted in its respective slit 241,242,3141,3142 in the sealing element 220. Different type of cables could have different outer diameters, hence need to be placed in a certain position. Already at this stage, the cables are held in place by the sealing element 220 itself. When the detachable cover 120 is mounted to the enclosure 110 it engages with the cable sealing assembly 200 so that the protruding member 210 and the recessed member 230 together apply an even pressure 290 on the cable sealing member 220 resulting in that each slit 241,242,3141,3142 closes and the cable sealing assembly 200 becomes water and dust tight. When the cable configuration need to be changed, the detachable cover 120 is removed again and all cables 130 are easily accessible.

When using the described cable assembly 200 in the cable entry 115 it has been tested and verified to comply with at least the rating IP65 according to the Ingress Protection standard IEC 60529.

The invention claimed is:

1. A cable sealing assembly for a cable entry in a cabinet, the cabinet configured to house electronic equipment and including an enclosure and a detachable cover, the cable sealing assembly comprising;
   a protruding member;
   an elastic cable sealing member having a plurality of through holes forming a single row, each hole configured to have a cable extending there through and wherein the cable sealing member is configured to be shaped around an edge of the protruding member; and
   a corresponding recessed member configured to receive the protruding member and the cable sealing member in between.

2. The cable sealing assembly of claim 1 wherein each hole in the cable sealing member is configured with a slit extending from the hole to the exterior of the sealing member as to permit insertion of a cable when pulled apart and wherein each slit is facing the recessed member.

3. The cable sealing assembly of claim 1, wherein the cable sealing member is a single preformed sealing element.

4. The cable sealing assembly of claim 1, wherein the cable sealing member comprises a plurality of preformed separate sealing elements located side-by-side, each sealing element comprising at least one hole with a slit.

5. The cable sealing assembly of claim 1, wherein the cable sealing member comprises a first and a second separate sealing element, each sealing element having a plurality of semi-circular cavities in a row and configured as to, when the two sealing elements are put together with the cavities face to face, form a single sealing element with through holes in a row each hole configured to have a cable extending there through.

6. The cable sealing assembly of claim 5, wherein the first sealing element is attached to the protruding member and the second sealing element is attached to the recessed member.

7. The cable sealing assembly claim 1, wherein at least two of the holes in the cable sealing member have different diameters.

8. The cable sealing assembly of claim 1, wherein the cable sealing member is made of a silicon based material.

9. The cable sealing assembly of claim 8, wherein the cable sealing member is made of a silicon based material having a flexibility range of A30-A50 on the Shore hardness scale.

10. The cable sealing assembly of claim 1, wherein the protruding member and the recessed member are made of metal and the cable sealing member is at least partly covered with a conductive layer configured to provide a low impedance path between the protruding member and the recessed member when the cable entry is sealed.

11. The cable sealing assembly of claim 1, wherein the protruding member is firmly mounted to or being an integral part of the enclosure.

12. The cable sealing assembly of claim 1, wherein the recessed member is firmly mounted to or being an integral part of the detachable cover.

13. The cable sealing assembly of claim 1, wherein the cable sealing assembly is further configured to seal the cable entry when the protruding member and the recessed member together apply an even pressure on the cable sealing member.

14. The cable sealing assembly of claim 1, wherein the sealing member is glued to the recessed member.

15. The cable sealing assembly of claim 1, wherein the sealing member is glued to the protruding member.

16. The cable sealing assembly of claim 1, wherein the protruding member is a tongue-shaped protruding member.

17. A cabinet comprising a cable sealing assembly as in claim 1, wherein the detachable cover is further configured to engage with the cable sealing assembly so that the protruding member and the recessed member applies an even pressure on the cable sealing member when the cover is mounted.

* * * * *